(12) United States Patent
Burbach et al.

(10) Patent No.: US 6,720,242 B2
(45) Date of Patent: Apr. 13, 2004

(54) METHOD OF FORMING A SUBSTRATE CONTACT IN A FIELD EFFECT TRANSISTOR FORMED OVER A BURIED INSULATOR LAYER

(75) Inventors: Gert Burbach, Dresden (DE); Frank Heinlein, Dresden (DE); Johannes Groschopf, Wainsdorf (DE); Gotthard Jungnickel, Radeberg (DE); Hartmut Ruelke, Dresden (DE); Carsten Hartig, Meerane (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/848,718

(22) Filed: May 3, 2001

(65) Prior Publication Data

US 2002/0055244 A1 May 9, 2002

(30) Foreign Application Priority Data

Oct. 31, 2000 (DE) .......................... 100 54 109

(51) Int. Cl.$^7$ ................................................ H01L 21/00
(52) U.S. Cl. ................... 438/586; 438/299; 438/303; 438/305; 438/586; 438/595
(58) Field of Search ................................ 438/299, 303, 438/305, 586, 595; 257/301

(56) References Cited

U.S. PATENT DOCUMENTS 6,174,794 B1 * 1/2001 Gardner et al. ............. 438/595
6,429,477 B1 * 8/2002 Mandelman et al. ....... 257/301

* cited by examiner

*Primary Examiner*—David Nelms
*Assistant Examiner*—Reneé R Berry
(74) *Attorney, Agent, or Firm*—Williams, Morgan & Amerson

(57) ABSTRACT

A method comprises a "two-step" formation of a front side substrate contact in an FET formed over a buried insulator layer on a substrate, thereby avoiding the difficulties and problems involved in etching openings of high aspect ratio through a stack of different materials, as in a conventional front side substrate contact opening.

15 Claims, 2 Drawing Sheets

METHOD OF FORMING A SUBSTRATE CONTACT IN A FIELD EFFECT TRANSISTOR FORMED OVER A BURIED INSULATOR LAYER

BACKGROUND OF THE INVENTION

1. Field of the Invention

The present invention relates to a method of forming a field effect transistor (FET) on a substrate having a buried insulator layer, such as silicon on insulator (SOI), and, in particular, to an improved method of forming a front side substrate contact for the FET device.

2. Description of the Related Art

The ever increasing demand for high speed integrated circuits has had a significant impact on the development of integrated circuits formed on an insulating substrate, such as SOI devices, due to their superior features with respect to reduced parasitic capacitance of the active transistor region and improved latch-up immunity. In an FET formed on a substrate having an insulating layer formed thereon, also referred to as a buried oxide layer when an SOI device is considered, a substrate contact is required for removing charge carriers that would otherwise accumulate below the channel region of the FET. For example, in an NMOS device, the drain diode is usually biased in the reverse direction, wherein the bias voltage often exceeds a voltage level sufficient to initiate a weak Avalanche breakdown. Accordingly, electron-hole pairs are generated in the drain region. Consequently, while the electrons drift away with the drain current, the holes float into the well and finally accumulate at the buried oxide layer. Charge carriers accumulated under the channel region, however, will significantly affect the electrical characteristics of the transistor device, such as gate threshold voltage, and will lead to an undesired deterioration of signal performance. Accordingly, additional contacts through the buried oxide layer and to the substrate are formed to discharge the inherent parasitic capacitors across the buried oxide. Corresponding substrate contacts can be formed either by a sophisticated packaging solution which is very time-consuming and, hence, cost-intensive, or by introducing front side substrate contacts through the buried oxide layer to the substrate.

With reference to FIG. 1, a typical prior art device and a typical prior art process for forming the device will be described in order to detail the problems involved with the formation of front side substrate contacts in an SOI device. As the skilled person will easily appreciate, the figures depicting the prior art processing and the prior art device are merely of a schematic nature, and transitions and boundaries illustrated as sharp lines may not be imparted as sharp transitions in a real device. Furthermore, the description of a typical prior art process refers to standard manufacturing procedures without specifying typical parameter values used for those procedures, since the individual processing steps may be slightly varied to meet specific design requirements.

FIG. 1 shows a schematic cross-section of a typical prior art FET device. On a substrate 101, which may be comprised of a semiconductor material or of any appropriate insulating material, an insulating layer 102, such as silicon dioxide, is formed. Over the insulating layer 102, a silicon layer 103 is disposed in which drain and source regions 104 and a channel region 105 are formed. A gate electrode 106 is located over the channel region 105 and spaced apart therefrom by a gate insulating layer 107. Adjacent to the sidewalls of the gate electrode 106, sidewall spacers 108 are formed. Over the gate electrode 106, the drain and source regions 104 and the sidewall spacers 108, an etch stop layer 109, which also serves as an anti-reflective coating, is formed. The entire structure is embedded in a dielectric layer 110 having a planarized surface. Moreover, source and drain contacts 111, a gate electrode contact 112, and a substrate contact 113 are shown in FIG. 1. It is to be noted that the gate electrode contact 112 is not on the same plane as the source and drain contacts 111, since usually the drain electrode is contacted at the ends of the transistor width dimension which, in the case of FIG. 1, is the direction that extends in a perpendicular manner to the drawing plane of FIG. 1.

A typical process for forming the structure shown in FIG. 1 may comprise the following process flow. After formation of a region of cobalt silicide (not shown) on and in the surface of the drain and source regions 104 and on and in the surface of the gate electrode 106, a dielectric bi-layer consisting of etch stop layer 109 and dielectric layer 110 is deposited by any appropriate deposition method, such as chemical vapor deposition (CVD). Next, the surface of the dielectric layer 110 is planarized by chemical mechanical polishing (CMP). As already mentioned, the underlying etch stop layer 109, which may be comprised of a nitride or a silicon oxynitride, has two functions. First, it serves as a bottom anti-reflective coating (BARC) layer for the critical contact hole lithography process. Second, it serves as an etch stop layer so as to allow a common etch step for the formation of openings 112A, 111A, respectively, for gate electrode contact 112 and the drain and source contacts 111, since different etch depths are required for the drain and source contacts, on the one hand, and the gate contact, on the other hand. Before or after the lithography step for forming the openings for the drain, source and gate contacts, a further masking and etch step is carried out to form an opening 113A for the substrate contact 113. As can be seen from FIG. 1, a stack of different materials has to be anisotropically etched without any undercuts or over-hangs that would disadvantageously affect the filling of the opening with an appropriate metal such as tungsten. Next, all openings 111A, 112A, 113A are filled with a common barrier layer followed by a tungsten deposition so as to form the drain and source contacts 111, the gate electrode contact 112, and the substrate contact 113. Finally, a further CMP step removes the excess barrier material and the excess tungsten material from the wafer surface.

As is clear from the above description, the formation of the front side substrate contact necessitates a difficult etch step for opening a narrow contact hole in a stack of different materials for subsequent refilling by a CVD process. Moreover, according to prior art processing, it may be such that, in forming the substrate contact, a masking step may be performed on a substrate comprising already-opened contacts, leading to further complications and difficulties in conjunction with, for example, application and removal of photoresist and the like.

Accordingly, there exists a need for an improved and cost-efficient method for forming front side substrate contacts for an FET transistor device formed over a buried insulator layer.

SUMMARY OF THE INVENTION

According to the present invention, a method of forming a substrate contact in a field effect transistor comprises providing a substrate with an insulation layer formed thereon, forming a semiconductor layer above the insulation layer, forming a transistor in an active region of the semiconductor layer, forming a first part of the substrate contact, the first part extending through the insulation layer and contacting the substrate, the first part having a first end that extends above a surface of the semiconductor layer, and forming a second part of the substrate contact above the first part of the substrate contact, the second part being electrically coupled to the first end of the first part of the substrate contact.

According to the present invention, the substrate contact of a field effect transistor is formed in two steps so as to eliminate the necessity of etching a contact hole having a large aspect ratio through a layer stack of different materials in a single step.

According to a further embodiment, the method further comprises depositing a dielectric layer stack comprising a stop layer in contact with a gate electrode of the field effect transistor, thinning and planarizing the dielectric layer stack, wherein material of the dielectric layer stack is maintained over the gate electrode with a predefined thickness that insures coverage of the gate electrode, forming a first substrate opening in the dielectric layer stack, the semiconductor layer, and the insulation layer by photolithography and etching, filling the first substrate opening with a contact metal to form the first part, removing excess contact metal from the dielectric layer stack to planarize the surface of the dielectric stack, depositing a dielectric layer with a predefined thickness over the dielectric layer stack and the first substrate opening, forming a second substrate contact opening over and aligned to the first part, forming in the dielectric layer stack and the dielectric layer, by using the stop layer, a drain contact opening over the drain region, a source contact opening over the source region, and a gate contact opening over the gate electrode, filling the second substrate contact opening with a second contact metal, thereby forming the second part, and filling the drain contact opening, the source contact opening, and the gate contact opening with the second contact metal, thereby forming a drain contact, a source contact, and a gate contact.

According to this process flow, a dielectric layer stack is deposited and polished to maintain a thin material layer of the dielectric layer stack so that the gate electrode is maintained intact. With a subsequent uncritical masking step, an opening for the substrate contact can be formed with an anisotropic etch step which does not require any selectivity to any of the layers affected by the etch step. On the contrary, the removing of substrate material to a certain degree is beneficial for obtaining the required electrical contact for removing accumulated charge carriers from the substrate.

In a subsequent step, the opening is filled with an appropriate contact metal so as to form a first substrate contact portion. Due to the drastically reduced aspect ratio of the opening compared to the opening to be etched according to the prior art processing, the filling of the opening is uncritical with respect to surface coverage of the opening. Subsequently, a further dielectric layer is deposited and an opening for a second substrate contact portion in registration with the first substrate contact portion is formed, wherein the etch step necessary for forming the second contact portion is less critical compared to the prior art processing since the etch depth is drastically reduced. According to this "two-step" formation of the front side substrate contact in conformity with the present invention, critical etching of narrow, deep contact openings through a plurality of different materials can be avoided, and hence the front side contact portion can reliably be refilled with an appropriate contact metal, such as tungsten.

In a further embodiment of the present invention, etching the second substrate contact opening, the drain contact opening, the source contact opening, and the gate contact opening is performed simultaneously. This is accomplished since, during etching of the source, gate, and drain openings, the contact metal in the already-filled first substrate contact portion ensures a high selectivity with respect to the dielectric layer stack. The high selectivity is advantageous since the etch depth of the source, drain, and gate electrode openings is larger than the depth of the second contact opening. Moreover, filling of the second substrate contact opening and filling of the drain contact opening, the source contact opening, and the gate contact opening may be performed simultaneously, resulting in a time-efficient and cost-effective manufacturing procedure.

BRIEF DESCRIPTION OF THE DRAWINGS

The invention may be understood by reference to the following description taken in conjunction with the accompanying drawings, in which like reference numerals identify like elements, and in which.

Figure 1:
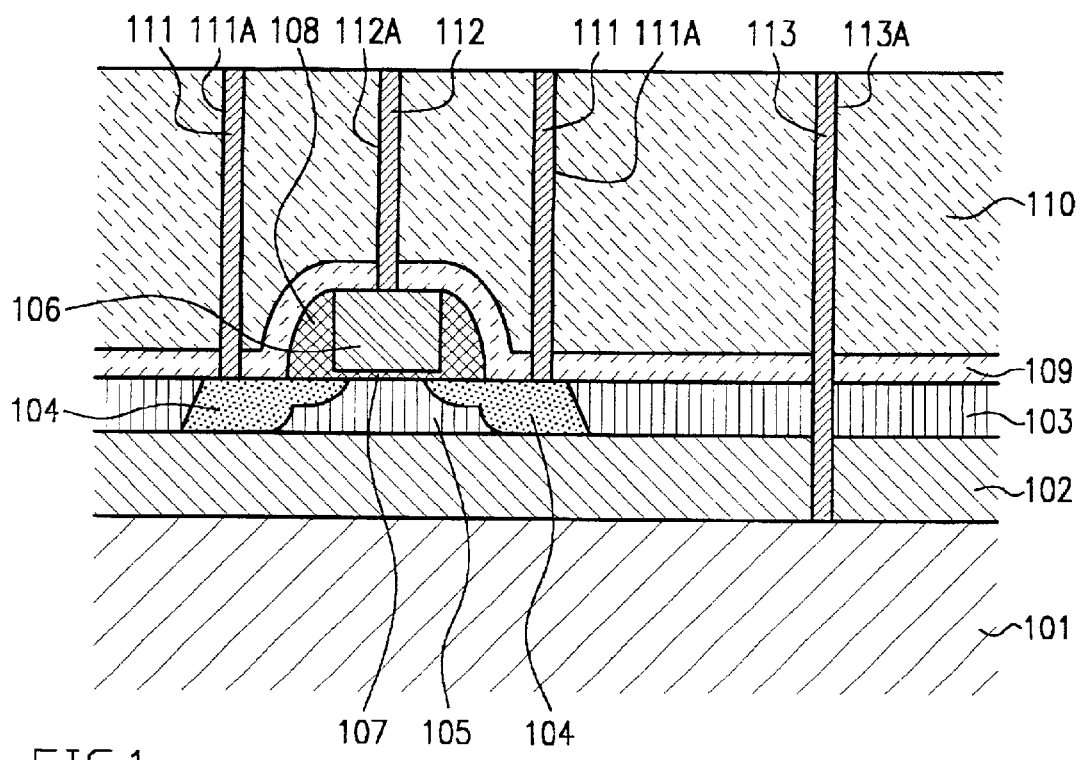
FIG. 1 is a schematic cross-sectional view of a typical prior art FET formed on a buried insulator layer located over a substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
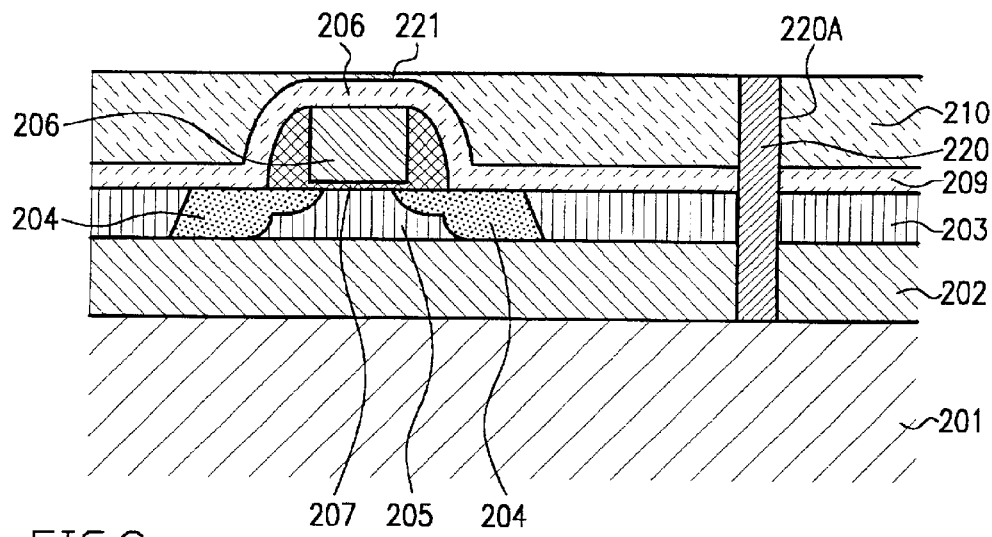
FIG. 2a is a schematic cross-sectional view of an FET device at a certain manufacturing stage in accordance with one embodiment of the present invention.

FIG. 2a schematically shows a cross-sectional view of an FET transistor at a certain manufacturing stage in accordance with the present invention. In FIG. 2a, an insulator layer 202, which may be comprised of, for example, silicon dioxide and the like, is located above a substrate 201, such as an insulating layer, a semiconductor substrate, e.g., silicon, and the like. On the insulator layer 202, which is also referred to as a "buried insulator layer," a semiconductor layer 203, e.g., silicon, is formed comprising drain and source regions 204 and a channel region 205. Over the channel region 205, a gate electrode 206, having sidewall spacers 208, is formed and separated therefrom by a gate insulation layer 207. A dielectric layer stack comprised of an etch stop layer 209 and a dielectric layer 210 is formed over the substrate and has a planarized surface. The portion of the dielectric layer 210 formed over the gate electrode 206 consists of a thin gate cover layer 221 of a predefined thickness that may range from approximately 0–500 Å. A first substrate contact portion 220 is formed through the dielectric layer stack 210, 209, the semiconductor layer 213, and the buried insulator layer 202.

The structure shown in FIG. 2a may be formed in accordance with the following process flow. As already described with reference to FIG. 1, the drain and source regions 204, the channel regions 205, the gate electrode 206, and the sidewall spacers 208 may be formed in accordance with a typical conventional process flow. Moreover, metal silicide portions (not shown) may be formed on top of the drain and source regions 204 and on top of the gate electrode 206, so as to reduce the electrical resistance of the drain and source regions 204 and the gate electrode 206. Subsequently, the dielectric layer stack comprising the etch stop layer 209 and the dielectric layer 210 are deposited over the structure by a standard CVD process using TEOS. It should be noted that due to the steadily decreasing gate length in modern semiconductor processes, the standard TEOS deposition step may result in a degraded gap filling. In the present invention, however, the TEOS process may easily be replaced by any appropriate high-density plasma enhanced deposition procedure and the like.

Next, the surface of the dielectric layer 210 is planarized, for example by chemical mechanical polishing, wherein material of the dielectric layer 210 is removed in such an amount that the gate cover layer 221, having a predefined thickness insuring integrity of the gate electrode 206, is maintained over the gate electrode 206. Thereafter, a lithography step is performed to provide a resist mask for a subsequent anisotropic etch step in order to form an opening 220A for the first substrate contact portion 220. The anisotropic etch step for forming the opening 220A for the first substrate contact portion 220 does not need to exhibit any selectivity to any of the layers through which the opening is etched. In particular, etching into the substrate 201 is advantageous for providing an improved electrical connection between the substrate 201 and the first substrate contact portion 220 to be formed in the opening 220A. The size and shape of the opening 220A may be varied as a matter of design choice and fill capabilities, i.e., the opening 220A may have a circular, square, or rectangular cross-sectional profile. In one illustrative embodiment, the opening 220A is a generally circular opening having a diameter ranging from approximately 3000–5000 Å.

Next, the opening 220A is filled by a first contact metal, such as tungsten. As the skilled person will readily appreciate, any other appropriate contact metal known in the art, such as aluminum, cobalt, titanium, tantalum, or a combination thereof, may be used. Prior to filling the opening with the first contact metal, a barrier layer may be deposited as was already mentioned with reference to FIG. 1. Subsequently, excess material of the first contact metal and excess material of the barrier layer is removed from the surface by a CMP step. The CMP process is used to produce an approximately planar surface which is useful in the further processing operations, such as a following dual damascene back end process. Moreover, the CMP step further ensures that any cavities formed in the layer 201 are eliminated which, otherwise, may trap photoresist in subsequent lithography steps. It should be noted that the aspect ratio of the first substrate contact portion 220 is not critical (1:1 to 1:1.5; diameter:height) and the extension of the contact portion 220 along the transistor length dimension is preferably selected so as to exceed the corresponding extension of a second substrate contact portion 223 (see FIG. 2b) to be formed and aligned with respect to the first substrate contact portion 220, as described more fully below.

Figure 2B:
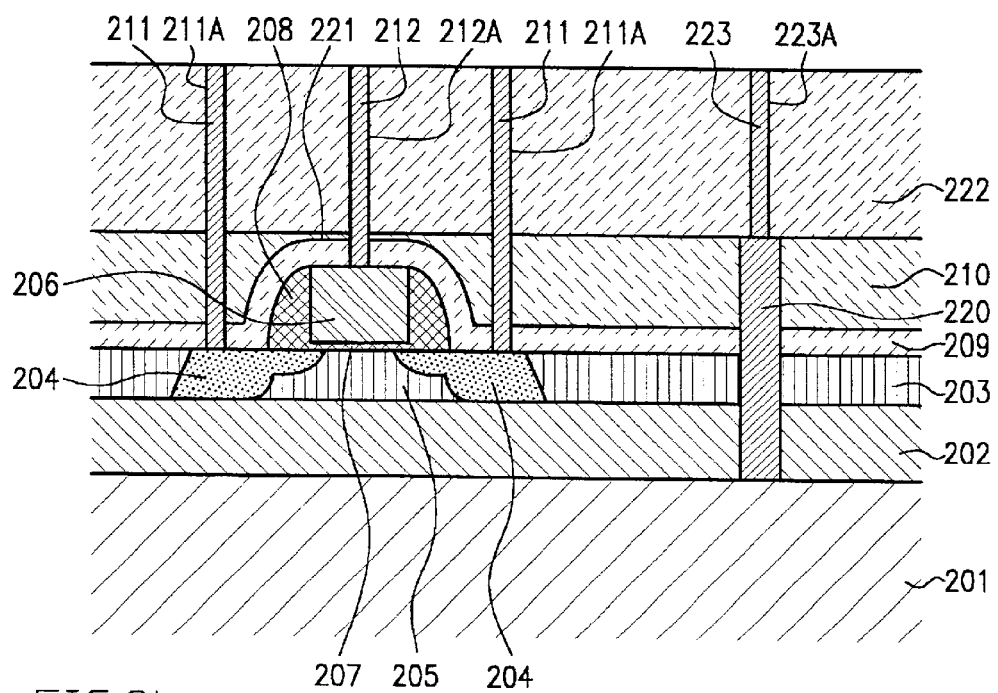
FIG. 2b is a schematic cross-sectional view of the transistor device of FIG. 2a in an advanced manufacturing stage in accordance with one embodiment of the present invention.

FIG. 2b schematically shows a cross-sectional view of the FET shown in FIG. 2a in an advanced manufacturing stage. FIG. 2b additionally depicts a second dielectric layer 222 formed over the dielectric layer 210, and drain and source contacts 211, a gate electrode contact 212, and a second substrate contact portion 223.

The formation of the structure shown in FIG. 2b may be accomplished by the following process flow. After the CMP step described with reference to FIG. 2a, the second dielectric layer 222, comprising, for example, silicon dioxide, is deposited by CVD from TEOS. In view of the high operation speed of an integrated circuit including a large number of FET devices as shown in FIG. 2b, it may be necessary to use a material having a low dielectric constant "k" as the second dielectric layer 222. Hence, a low-k material, such as SILK, SICOH, etc., may be deposited with the required thickness instead of silicon dioxide. Moreover, any appropriate deposition process required for forming the low-k material layer may be employed in conformity with the present invention. Subsequently, a photolithographic step is performed to provide a photoresist mask for forming openings 211A, 212A and 223A, respectively, for the drain and source contacts 211, the gate electrode contact 212, and the second substrate contact portion 223. Preferably, these openings 211A, 212A, 223A are formed during the same etch process, however a subsequent formation of the drain and source contacts 211, on the one hand, and the gate electrode contact 212 and the second substrate contact portion 223, on the other hand, is also within the scope of the present invention. The size of the second portion 223 can be matched with the scaling rules for the technologies so that only a unique shape for contacts 211, 212 and 223 has to be printed and etched.

The subsequent etch step for forming the corresponding contact openings 211A, 212A, 223A is less critical as compared with the prior art steps. In particular, since the etch depth of the second substrate contact portion 223 is drastically reduced and comparable to contact 212 due to the "two-step" processing disclosed herein for forming the front side substrate contact of the FET device. In the present process, the first contact metal, which is, for example, tungsten, exhibits a high selectivity to the material forming the second dielectric layer 222, which, for example, may be silicon dioxide and/or an appropriate low-k material. Thus, in the etch process used to form the corresponding openings 211A, 212A, 223A, the different etch depths of the drain and source contacts 211, on the one side, and the etch depth of the opening 223A for the second substrate contact portion 223, on the other side, do not adversely influence the etch process. In contrast to prior art techniques, the present invention does not require any etch step with a high selectivity to the plurality of material layers through which the substrate opening is etched in the single etch step according to the prior art. Moreover, contrary to the prior art process, the present invention allows the formation of the openings 211A, 212A, and 223A in a common etch process.

Thereafter, a second contact metal, such as tungsten, aluminum, titanium, tantalum, or any combination thereof is deposited over the structure by a further CVD process to fill the openings 211A, 212A and 223A. Prior to depositing the second contact metal, a barrier layer may be deposited so as to provide good adhesion of the contact metal to the surfaces of the openings and to avoid diffusion of the contact metal into adjacent areas. Due to the reduced aspect ratio of the second substrate contact portion 223 compared to the substrate contact portion in the prior art (nearly 1:1 compared to 1:3 to 1:5), the process of filling the three different types of contact openings, i.e., drain and source contact opening 211A, gate electrode contact opening 212A, and second substrate contact opening 223A, may preferably be carried out during the same deposition process. In a subsequent CMP step, the surface of the structure is planarized by removing any excess material of the second contact metal and providing a planar surface for a further dual damascene back end processing.

As previously mentioned, the material of the dielectric layer 210 as well as the corresponding deposition procedure may be selected in conformity with design requirements to provide a sufficient gap filling ability required for future generations of downsized FET devices. The second dielectric layer 222 may be selected as a low-k material for lowering the metal-to-substrate capacitance, thereby enhancing circuit performance of an integrated circuit having a large number of FET formed therein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a substrate contact in a field effect transistor, comprising:

providing a substrate with an insulation layer formed thereon;

forming a semiconductor layer above the insulation layer;

forming a transistor in an active region of said semiconductor layer;

forming a first part of said substrate contact, said first part extending through said insulation layer and contacting said substrate, said first part having a first end that extends above a surface of said semiconductor layer; and forming a second part of said substrate contact above said first part of said substrate contact, said second part being electrically coupled to said first end of said first part of said substrate contact.

2. The method of claim 1, further comprising:

depositing a dielectric layer stack comprising a stop layer in contact with a gate electrode of the field effect transistor;

thinning and planarizing the dielectric layer stack, wherein material of the dielectric layer stack is maintained over the gate electrode with a predefined thickness that insures coverage of the gate electrode;

forming a first substrate opening in the dielectric layer stack, the semiconductor layer, and the insulation layer by photolithography and etching;

filling the first substrate opening with a contact metal to form said first part;

removing excess contact metal from the dielectric layer stack to planarize the surface of the dielectric stack;

depositing a dielectric layer with a predefined thickness over the dielectric layer stack and the first substrate opening;

forming a second substrate contact opening over and aligned to the first part;

forming in the dielectric layer stack and the dielectric layer, by using the stop layer, a drain contact opening over the drain region, a source contact opening over the source region, and a gate contact opening over the gate electrode;

filling the second substrate contact opening with a second contact metal, thereby forming said second part; and filling the drain contact opening, the source contact opening, and the gate contact opening with the second contact metal, thereby forming a drain contact, a source contact, and a gate contact.

3. The method of claim 2, wherein forming the second substrate contact opening, the drain contact opening, the source contact opening, and the gate contact opening is performed during the same etch process.

4. The method of claim 2, wherein filling the second substrate contact opening and filling the drain contact opening, the source contact opening, and the gate contact opening is performed during the same filling process.

5. The method of claim 2, wherein the dielectric layer stack is deposited by plasma enhanced chemical vapor deposition.

6. The method of claim 2, wherein the first substrate contact opening is formed so as to extend into the substrate.

7. The method of claim 2, wherein removing the excess contact metal comprises chemically mechanically polishing the surface so as to avoid any cavities formed therein.

8. The method of claim 2, wherein forming the second substrate contact opening, the drain contact opening, the source contact opening, and the gate contact opening is performed by simultaneously etching while the contact metal provides a high selectivity in removing material of the dielectric layer.

9. The method of claim 1, wherein forming the first part of the substrate contact and forming the second part of the substrate contact includes depositing a metal barrier layer prior to filling with the contact metal and the second contact metal, respectively.

10. The method of claim 2, wherein the contact metal and the second contact metal are the same.

11. The method of claim 2, wherein the dielectric layer comprises a material having a low dielectric constant k.

12. The method of claim 11, wherein the k is less than 4.0.

13. The method of claim 2, wherein the stop layer serves as an anti-reflecting coating.

14. The method of claim 13, wherein the stop layer comprises one of silicon nitride and silicon oxynitride.

15. The method of claim 2, wherein the material of the dielectric layer stack that is maintained over the gate electrode comprises material of the stop layer.

* * * * *